(12) United States Patent
Funahashi et al.

(10) Patent No.: US 9,054,274 B2
(45) Date of Patent: Jun. 9, 2015

(54) THERMOELECTRIC CONVERSION ELEMENT, METHOD FOR MANUFACTURING SAME, AND COMMUNICATION DEVICE

(71) Applicant: Murata Manufacturing Co., Ltd., Nagaokakyo-shi, Kyoto-fu (JP)

(72) Inventors: Shuichi Funahashi, Nagaokakyo (JP); Sachiko Hayashi, Nagaokakyo (JP); Takanori Nakamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 56 days.

(21) Appl. No.: 13/738,029

(22) Filed: Jan. 10, 2013

(65) Prior Publication Data

US 2014/0020729 A1 Jan. 23, 2014

Related U.S. Application Data

(63) Continuation of application No. PCT/JP2011/063554, filed on Jun. 14, 2011.

(30) Foreign Application Priority Data

Jul. 20, 2010 (JP) ................. 2010-162842

(51) Int. Cl.
*H01L 35/32* (2006.01)
*H01L 35/12* (2006.01)
(Continued)

(52) U.S. Cl.
CPC ............... *H01L 35/34* (2013.01); *C04B 35/47* (2013.01); *H01L 35/22* (2013.01); *H01L 35/32* (2013.01);
(Continued)

(58) Field of Classification Search
CPC ......... H01L 35/00; H01L 35/02; H01L 35/04; H01L 35/08; H01L 35/12; H01L 35/22; H01L 35/20
USPC .................................. 136/200–242
See application file for complete search history.

(56) References Cited

U.S. PATENT DOCUMENTS 3,902,923 A * 9/1975 Evans et al. .................. 136/203
5,275,001 A 1/1994 Yokotani et al.
(Continued)

FOREIGN PATENT DOCUMENTS

JP   1-262678 A   10/1989
JP   5-198847 A   8/1993
(Continued)

OTHER PUBLICATIONS

Official Communication issued in International Patent Application No. PCT/JP2011/063554, mailed on Sep. 13, 2011.

*Primary Examiner* — Christina Chern
(74) *Attorney, Agent, or Firm* — Keating & Bennett, LLP

(57) ABSTRACT

A thermoelectric conversion element includes a p-type metal thermoelectric conversion material containing a metal as its main constituent, an n-type oxide thermoelectric conversion material containing an oxide as its main constituent, and a composite oxide insulating material containing a composite oxide as its main constituent. The p-type metal thermoelectric conversion material and the n-type oxide thermoelectric conversion material are directly bonded in a region of a junction plane between the p-type metal thermoelectric conversion material and the n-type oxide thermoelectric conversion material, and the p-type metal thermoelectric conversion material and the n-type oxide thermoelectric conversion material are bonded to each other with the composite oxide insulating material interposed therebetween so as to define a pn conjunction pair in the other region of the junction plane. A perovskite-type oxide is used as the n-type oxide thermoelectric conversion material.

10 Claims, 4 Drawing Sheets

(51) Int. Cl.
  *H01L 35/34* (2006.01)
  *C04B 35/47* (2006.01)
  *H01L 35/22* (2006.01)
  *F27D 7/06* (2006.01)
  *C22C 29/12* (2006.01)
  *C22C 32/00* (2006.01)

(52) U.S. Cl.
  CPC . *F27D 7/06* (2013.01); *C22C 29/12* (2013.01); *C22C 32/001* (2013.01); *C04B 2235/3213* (2013.01); *C04B 2235/3232* (2013.01)

(56) References Cited

U.S. PATENT DOCUMENTS

2010/0116308 A1   5/2010   Hayashi et al.
2010/0218796 A1*  9/2010   Hiroyama ............... 136/238

FOREIGN PATENT DOCUMENTS

| JP | 2008-182160 A | 8/2008 |
| JP | 2008-199735 A | 8/2008 |
| WO | 95/17020 A1 | 6/1995 |
| WO | 2009/001691 A1 | 12/2009 |

* cited by examiner

THERMOELECTRIC CONVERSION ELEMENT, METHOD FOR MANUFACTURING SAME, AND COMMUNICATION DEVICE

BACKGROUND OF THE INVENTION

1. Field of the Invention

The present invention relates to a thermoelectric conversion element including a structure in which a p-type thermoelectric conversion material and an n-type thermoelectric conversion material are bonded directly in a region of a junction plane, and bonded to each other with an insulating material interposed therebetween in the other region of the junction plane, a method for manufacturing the thermoelectric conversion element, and a communication device.

2. Description of the Related Art

In recent years, in order to prevent global warming, the reduction of carbon dioxide has been an important objective, and attention has been focused on thermoelectric conversion elements capable of converting heat directly into electricity, as one of the effective techniques for waste heat utilization.

As such a thermoelectric conversion element, for example, a thermoelectric conversion element 40 is known which includes a p-type thermoelectric conversion material 41, an n-type thermoelectric conversion material 42, a lower temperature side electrode 46, and a higher temperature side electrode 48 as shown in FIG. 4.

In this thermoelectric conversion element 40, the two types of thermoelectric conversion materials 41, 42 are energy conversion materials that convert energy between heat and electricity, and are connected to the lower temperature side electrode 46 at lower temperature side junctions 43b as lower temperature side end surfaces of the respective materials. In addition, the thermoelectric conversion materials 41, 42 are, at higher temperature side junctions 43a as higher temperature side end surfaces, connected to each other with the higher temperature side electrode 48 interposed therebetween.

Further, in this thermoelectric conversion element 40, when a temperature difference is produced between the higher temperature side junctions 43a and the lower temperature side junctions 43b, an electromotive force is generated by the Seebeck effect, and power is extracted.

However, in the case of this thermoelectric conversion element 40, the electrodes 46, 48 are used for the connection between the two types of thermoelectric conversion materials 41, 42, and the thermoelectric conversion element 40 thus has the problem of contact resistance produced between the electrodes and the thermoelectric conversion materials.

In addition, in the case of this thermoelectric conversion element 40, a clearance layer for insulation is provided between the two types of thermoelectric conversion materials 41, 42, and there is thus a limit on increasing the occupancy of the thermoelectric conversion materials. In addition, the thermoelectric conversion element 40 has the problem of being likely to be damaged by impacts such as dropping, because the clearance is provided between the two types of thermoelectric conversion materials 41, 42.

Therefore, as a thermoelectric conversion element capable of solving such problems as described above, a thermoelectric conversion element 70 has been proposed which has, as shown in FIG. 5, a plurality of connected pn junction pairs 60 obtained by directly bonding a p-type oxide thermoelectric conversion material 61 of an oxide as well as an n-type oxide thermoelectric conversion material 62 of an oxide (see WO 2009/001691).

More specifically, in this thermoelectric conversion element 70, the p-type oxide thermoelectric conversion material 61 and the n-type oxide thermoelectric conversion material 62 are bonded directly in a region of the junction plane, and bonded to each other with an insulating material 63 interposed therebetween in the other region of the junction plane. In addition, first and second electrodes 64a, 64b for power extraction are provided on both lower ends (lower temperature side junctions) of the structure with the plurality of (three in FIG. 5) pn junction pairs 60 connected.

This thermoelectric conversion element 70 in WO 2009/001691 is not provided with any clearance layer for insulation between the p-type oxide thermoelectric conversion material and the n-type oxide thermoelectric conversion material, and thus can increase the occupancy of the thermoelectric conversion materials, thereby making it possible to increase the power generation capacity. In addition, the resistance at the junctions can be reduced because there is no need to use any electrodes for the connection between the two types of thermoelectric conversion materials 61, 62.

In addition, in the thermoelectric conversion element in WO 2009/001691, for example, $(LaSr)CuO_4$ is used as the p-type thermoelectric conversion material, whereas $(PrCe)CuO_4$ is used as the n-type thermoelectric conversion material, and these materials are oxide materials which have layered perovskite structures, and thus correspond to a material combination preferred for co-sintering in the atmosphere. Therefore, WO 2009/001691 has the feature of being able to achieve highly reliable thermoelectric conversion elements efficiently without the need of any special firing method such as firing under pressure.

However, even in the case of the oxide thermoelectric conversion materials used in WO 2009/001691, the output factors are not always sufficient, and currently, there has been demand for thermoelectric conversion elements capable of achieving higher electromotive forces.

SUMMARY OF THE INVENTION

In view of the actual circumstances described above, preferred embodiments of the present invention provide a thermoelectric conversion element which has a low resistance, a high thermoelectric conversion material occupancy, and a high thermoelectric conversion efficiency; a method for manufacturing a thermoelectric conversion element, which is able to efficiently manufacture the thermoelectric conversion element; and a communication device.

A thermoelectric conversion element according to a preferred embodiment of the present invention includes a p-type metal thermoelectric conversion material containing a metal as a main constituent; an n-type oxide thermoelectric conversion material containing an oxide as a main constituent; and a composite oxide insulating material containing a composite oxide as its main constituent, wherein the p-type metal thermoelectric conversion material and the n-type oxide thermoelectric conversion material are directly bonded in a region of a junction plane between the p-type metal thermoelectric conversion material and the n-type oxide thermoelectric conversion material, and the p-type metal thermoelectric conversion material and the n-type oxide thermoelectric conversion material are bonded to each other with the composite oxide insulating material interposed therebetween in the other region of the junction plane so as to define a pn conjunction pair.

In the thermoelectric conversion element according to a preferred embodiment of the present invention, preferably, an n-type oxide thermoelectric conversion material including a perovskite-type oxide represented by a composition formula $ABO_3$ (A and B are one or more elements) is used as the n-type oxide thermoelectric conversion material, and the n-type oxide thermoelectric conversion material, the p-type metal thermoelectric conversion material, and the composite oxide insulating material are co-sintered together.

In addition, there is preferably a difference within about 50° C. in shrinkage start temperature in a thermo-mechanical analysis (TMA) between the p-type metal thermoelectric conversion material and the n-type oxide thermoelectric conversion material.

In addition, the p-type metal thermoelectric conversion material preferably includes the n-type oxide thermoelectric conversion material.

In addition, the n-type oxide thermoelectric conversion material contained in the p-type metal thermoelectric conversion material preferably has a ratio of about 5 weight % to about 50 weight %, for example.

In addition, the p-type metal thermoelectric conversion material contains a Ni alloy as its main constituent, and the perovskite-type oxide represented by the composition formula $ABO_3$, which constitutes the n-type oxide thermoelectric conversion material, is a perovskite-type oxide containing at least Sr as A, and containing at least Ti as B.

In addition, preferably, a plurality of the pn junction pair is connected, and the p-type metal thermoelectric conversion material is provided on both ends.

In addition, a method for manufacturing a thermoelectric conversion element according to another preferred embodiment of the present invention is a method for manufacturing a thermoelectric conversion element including a structure in which a p-type metal thermoelectric conversion material and an n-type oxide thermoelectric conversion material are bonded directly in a region of a junction plane between the p-type metal thermoelectric conversion material and the n-type oxide thermoelectric conversion material, where the p-type metal thermoelectric conversion material and the n-type oxide thermoelectric conversion material are bonded to each other with a composite insulating material interposed therebetween in the other region of the plane, the method including the steps of forming a p-type metal thermoelectric conversion material sheet containing, as its main constituent, the p-type metal thermoelectric conversion material according to one of the preferred embodiments described above; forming an n-type oxide thermoelectric conversion material sheet containing, as its main constituent, the n-type oxide thermoelectric conversion material according to one of the preferred embodiments described above; applying a composite oxide insulating material containing a composite oxide as its main constituent, onto a region of a surface of at least one of the p-type metal thermoelectric conversion material sheet and the n-type oxide thermoelectric conversion material sheet, with the surface to serve as a junction plane between the both sheets; stacking the p-type metal thermoelectric conversion material sheet and the n-type oxide thermoelectric conversion material sheet to form a laminated body in which the p-type metal thermoelectric conversion material sheet and the n-type oxide thermoelectric conversion material sheet are bonded directly in a region of the junction plane between the both sheets, and bonded to each other with the composite oxide insulating material interposed therebetween in the other region; and firing the laminated body in vacuum or in a reducing atmosphere to obtain a thermoelectric conversion element in which the p-type metal thermoelectric conversion material, the n-type oxide thermoelectric conversion material, and the composite oxide insulating material are co-sintered.

In addition, a communication device according to a further preferred embodiment of the present invention is a communication device including a power management circuit unit, a wireless communication transceiver unit, and a power generation element, and includes the thermoelectric conversion element according to any of the preferred embodiments described above as the power generation element.

In the thermoelectric conversion element according to a preferred embodiment of the present invention, the p-type metal thermoelectric conversion material containing a metal as its main constituent and the n-type oxide thermoelectric conversion material containing an oxide as its main constituent are directly bonded in a region of the junction plane between both materials, and bonded to each other with the composite oxide insulating material interposed therebetween in the other region of the junction plane so as to define a pn conjunction pair, and a metal thermoelectric conversion material which typically exhibits a high thermoelectric property is used as the p-type thermoelectric conversion material. Thus, preferred embodiments of the present invention make it possible to achieve a thermoelectric conversion element which has a high thermoelectric conversion efficiency.

In addition, the p-type metal thermoelectric conversion material and the n-type oxide thermoelectric conversion material are bonded directly. Thus, as compared with a case of connecting a p-type thermoelectric conversion material and an n-type thermoelectric conversion material to each other with an electrode interposed therebetween, preferred embodiments of the present invention enable the occupancy of the thermoelectric conversion materials to be increased so as to improve thermoelectric conversion efficiency.

In addition, the p-type metal thermoelectric conversion material and the n-type oxide thermoelectric conversion material are bonded directly. Thus, as compared with a case of connecting p-type metal thermoelectric conversion material and n-type oxide thermoelectric conversion material with an electrode interposed therebetween, preferred embodiments of the present invention eliminate the contact resistance between the electrode and the thermoelectric conversion materials to lower the resistance.

In addition, the use of, for the insulating layer, the composite oxide insulating material containing a composite oxide as its main constituent makes it possible to make the insulating layer thinner so as to make it possible to increase the integration of the thermoelectric conversion element (thermoelectric conversion module).

It is to be noted that while a material containing, as its main constituent, a composite oxide containing glass is preferably used as the composite oxide insulating material because a high insulating property can be ensured while keeping down the thickness of the insulating material layer, it is also possible to use a material containing no glass.

In the thermoelectric conversion element according to various preferred embodiments of the present invention, a n-type oxide thermoelectric conversion material including the perovskite-type oxide represented by the composition formula $ABO_3$ is used as the n-type oxide thermoelectric conversion material, and the n-type oxide thermoelectric conversion material, the p-type metal thermoelectric conversion material, and the composite oxide insulating material are co-sintered together. Thus, preferred embodiments of the present invention make it possible to ensure that the p-type metal thermoelectric conversion material and n-type oxide thermoelectric conversion material are bonded directly, and allows the composite oxide insulating material to ensure insulation in the other region, that is, the region to be insulated by the insulating layer so as to make it possible to provide a thermoelectric conversion element which has a high thermoelectric conversion material occupancy, favorable characteristics, and high reliability.

In addition, there is a difference within about 50° C. in shrinkage start temperature in a thermo-mechanical analysis between the p-type metal thermoelectric conversion material and the n-type oxide thermoelectric conversion material. Thus, even when the p-type metal thermoelectric conversion material and the n-type oxide thermoelectric conversion material are different types of thermoelectric conversion materials from each other, preferred embodiments of the present invention improve the affinity between the both materials so as to make it possible to ensure that a thermoelectric conversion element is achieved which has the p-type metal thermoelectric conversion material and n-type oxide thermoelectric conversion material co-sintered and bonded directly, without using any special firing method such as firing under pressure.

In addition, the n-type oxide thermoelectric conversion material contained in the p-type metal thermoelectric conversion material causes both materials to be bonded with the oxide material interposed therebetween, thus making it possible to further improve the affinity between the both materials, and further ensure that a thermoelectric conversion element is achieved which has the materials directly bonded In addition, the ratio of about 5 weight % to about 50 weight % for the n-type oxide thermoelectric conversion material contained in the p-type metal thermoelectric conversion material makes it possible to improve the affinity with the n-type oxide thermoelectric conversion material while ensuring the properties as the p-type metal thermoelectric conversion material so as to make preferred embodiments of the present invention more effective.

In addition, a material containing a Ni alloy as its main constituent is preferably used as the p-type metal thermoelectric conversion material, and a perovskite-type oxide with the A site containing Sr and the B site containing Ti is preferably used as the perovskite-type oxide represented by the composition formula $ABO_3$, which constitutes the n-type oxide thermoelectric conversion material. Thus, preferred embodiments of the present invention make it possible to achieve a thermoelectric conversion element which has a high thermoelectric conversion efficiency, moreover a high thermoelectric conversion material occupancy, and favorable characteristics.

Further, for example, when a $SrTiO_3$-based material is used as the n-type oxide thermoelectric conversion material, the firing in vacuum or in a reducing atmosphere makes it possible to make a p-type metal thermoelectric conversion material which typically exhibits a high thermoelectric property (for example, a p-type metal thermoelectric conversion material using a Ni alloy) and the n-type oxide thermoelectric conversion material co-sintered without using any special firing method so as to achieve a highly co-fired thermoelectric conversion element which is superior in thermoelectric conversion efficiency to a case of using oxides for both the p-type thermoelectric conversion material and the n-type thermoelectric conversion material.

In addition, in the thermoelectric conversion element according to a preferred embodiment of the present invention, the number of pn junction pairs is not particularly limited, and the thermoelectric conversion element may include one pn junction pair, or a plurality of pn junction pairs are connected to each other. In the case of connecting a plurality of pn junction pairs, a high thermoelectromotive force can be generated.

In addition, when the p-type metal thermoelectric conversion material is provided on the both ends, the structure has the metal material provided on the both ends of the element. Thus, the need to further provide any electrode for power extraction is eliminated so as to make it possible to significantly reduce manufacturing cost.

Furthermore, the method for manufacturing a thermoelectric conversion element according to a preferred embodiment of the present invention is a method for manufacturing a thermoelectric conversion element including a structure in which a p-type metal thermoelectric conversion material and an n-type oxide thermoelectric conversion material are bonded directly in a region of the junction plane between the p-type metal thermoelectric conversion material and the n-type oxide thermoelectric conversion material, where p-type metal thermoelectric conversion material and the n-type oxide thermoelectric conversion material are bonded to each other with a composite oxide insulating material interposed therebetween in the other region of the plane, and the method includes forming a p-type metal thermoelectric conversion material sheet containing, as its main constituent, the p-type metal thermoelectric conversion material according to any of the preferred embodiments of the present invention described above and an n-type oxide thermoelectric conversion material sheet containing, as its main constituent, the n-type oxide thermoelectric conversion material according to any of the preferred embodiments of the present invention; applying a composite oxide insulating material containing a composite oxide as its main constituent, onto a region of a surface of at least one of the sheets, with the surface to serve as the junction plane between the both sheets; stacking the both sheets to form a laminated body in which the p-type metal thermoelectric conversion material sheet and the n-type oxide thermoelectric conversion material sheet are bonded directly in a region of the junction plane between the both sheets, and bonded to each other with the composite oxide insulating material interposed therebetween in the other region; and firing the laminated body in vacuum or in a reducing atmosphere to have the p-type metal thermoelectric conversion material, n-type oxide thermoelectric conversion material, and composite oxide insulating material co-sintered. Thus, the thermoelectric conversion element according to a preferred embodiment of the present invention can be manufactured effectively and reliably.

In addition, the communication device according to another preferred embodiment of the present invention is a communication device including a power management circuit unit, a wireless communication transceiver unit, and a power generation element, and in the communication device, the thermoelectric conversion element according to one of the preferred embodiments of the present invention is used as the power generation element. Thus, preferred embodiments of the present invention make it possible to provide a communication device which is able to use ambient heat as a power source for wireless communications, small in size, economically efficient, and highly reliable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
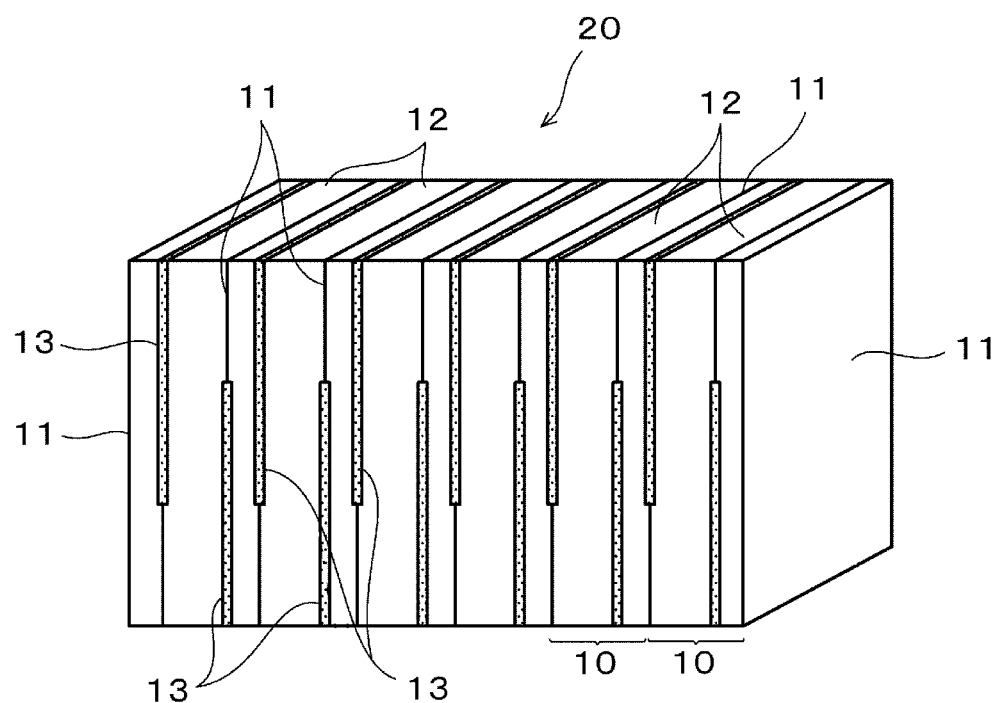
FIG. 1 is a diagram illustrating the configuration of a thermoelectric conversion element according to a preferred embodiment of the present invention.

Preferred embodiments of the present invention will be described below in more detail with reference to examples of the present invention.

Example 1

In Example 1, which is a non-limiting example of a preferred embodiment of the present invention, a thermoelectric conversion element including a structure in which a p-type thermoelectric conversion material and an n-type thermoelectric conversion material are bonded directly in a region of a junction plane, and bonded to each other with an insulating material interposed therebetween in the other region of the junction plane was prepared, and evaluated for the characteristics in accordance with the following procedures.
(1) N-Type Oxide Thermoelectric Conversion Material First, a $La_2O_3$ powder, a $SrCO_3$ powder, and a $TiO_2$ powder were prepared as starting raw materials for the n-type oxide thermoelectric conversion material.

Then, the $La_2O_3$ powder, the $SrCO_3$ powder, and the $TiO_2$ powder were weighed so as to provide the composition shown in Table 1.

TABLE 1

| p-type metal thermoelectric conversion material | n-type oxide thermoelectric conversion material |
|---|---|
| $Ni_{0.9}Mo_{0.1}(100 - X)$ wt % + $(Sr_{0.965}La_{0.035})TiO_3 X$ wt % (in the formula, X = 5, 10, 20, or 50) | $(Sr_{0.965}La_{0.035})TiO_3$ |

The weighed powders (starting raw material powders) were put in a ball mill along with pure water (solvent) and PSZ media, and subjected to grinding in a ball mill for 16 hours, thereby providing a slurry.

Then, the obtained slurry was dried, and then subjected to calcination at 1300° C., thereby providing an n-type oxide thermoelectric conversion material (calcined powder).

The obtained n-type oxide thermoelectric conversion material (calcined powder) was subjected to grinding in a ball mill for 5 hours, and the obtained powder was further mixed for 16 hours with the addition of ethanol, a binder, etc. thereto. Then, the obtained slurry was formed into sheets by a doctor blade method, thereby preparing n-type oxide thermoelectric conversion material sheets to be about 25 μm in thickness after firing, for example.
(2) P-Type Metal Thermoelectric Conversion Material Next, a metal Ni powder and a metal Mo powder were prepared as starting raw materials for the p-type metal thermoelectric conversion material.

Then, the metal Ni powder, the metal Mo powder, and the n-type oxide thermoelectric conversion material (calcined powder) prepared in the way described above were weighed so as to provide the composition shown in Table 1, and subjected to grinding in a ball mill for 5 hours as in the case of preparing the n-type oxide thermoelectric conversion material in the above section (1), and the obtained powder was further mixed for 16 hours with the addition of ethanol, a binder, etc. thereto.

Then, the obtained slurry was formed into sheets by a doctor blade method, thereby preparing p-type metal thermoelectric conversion material sheets to be 25 μm in thickness after firing.

It is to be noted that the value of X in the formula in the column of p-type metal thermoelectric conversion material in Table 1:

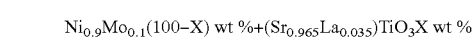

$Ni_{0.9}Mo_{0.1}(100-X)$ wt %+$(Sr_{0.965}La_{0.035})TiO_3 X$ wt % was varied to 5, 10, 20, and 50 to prepare four types of p-type metal thermoelectric conversion materials of different compositions in this example.
(3) Insulating Paste for Use in Formation of Insulator (Composite Oxide Insulating Material)

Next, a $Zr_{0.97}Y_{0.03}O_2$ powder, varnish, and a solvent were mixed as materials for forming the insulator (composite oxide insulating material), and subjected to kneading by a roll machine to prepare an insulating paste.
(4) Preparation of Thermoelectric Conversion Element The insulating paste described above was printed to be 10 μm in thickness in predetermined positions for each of the n-type oxide thermoelectric conversion material sheets and p-type metal thermoelectric conversion material sheets prepared in the way described above.

Then, the n-type oxide thermoelectric conversion material sheets and p-type metal thermoelectric conversion material sheets with the insulating paste applied thereto in the way described above, and n-type oxide thermoelectric conversion material sheets with no insulating paste applied thereto were stacked as follows to form a laminate block.

One of the p-type metal thermoelectric conversion material sheets with the insulating paste applied thereto, three of the n-type oxide thermoelectric conversion material sheets with no insulating paste applied thereto, and one of the n-type oxide thermoelectric conversion material sheets with the insulating paste applied thereto were stacked in this order, with the respective sheets sequentially stacked so as to reach 50 pairs in total, and finally, the p-type metal thermoelectric conversion material sheet with no insulating paste applied thereto was stacked to prepare a laminate block. Thus, finally, a thermoelectric conversion element 20 (see FIG. 1) was obtained with the p-type metal thermoelectric conversion material provided at both ends.

Thereafter, the prepared laminate block was subjected to pressure bonding at 180 MPa by an isostatic press method, and then cut with a dicing saw into a predetermined size, thereby providing an unfired laminated body (laminated element).

The laminated body obtained was subjected to degreasing at 270° C. in the atmosphere, and then to firing at 1200° C. to 1350° C. in a reducing atmosphere with an oxygen partial pressure of $10^{-10}$ to $10^{-15}$ MPa, thereby providing a fired body.

Thus, as schematically illustrated in FIG. 1, the thermoelectric conversion element 20 is obtained which preferably includes, for example, fifty bonded pn junction pairs 10 in total, each composed of a p-type metal thermoelectric conversion material 11 of 25 μm in thickness and an n-type oxide thermoelectric conversion material 12 of 100 μm in thickness, and has p-type metal thermoelectric conversion materials 11 provided at both ends to also serve as electrodes for power extraction. The obtained thermoelectric element has an approximate size of 6 mm×7 mm×2.7 mm, for example.

It is to be noted that this thermoelectric conversion element 20 has a structure with the p-type metal thermoelectric conversion material 11 and n-type oxide thermoelectric conversion material 12 bonded directly in a region of the junction plane between the both materials, and the p-type metal thermoelectric conversion material 11 and n-type oxide thermoelectric conversion material 12 bonded to each other with the composite oxide insulating material 13 interposed therebetween in the other region of the junction plane.

(5) Measurement of Shrinkage Start Temperature

Four of the n-type oxide thermoelectric conversion material sheets and four of the p-type metal thermoelectric conversion material sheets were stacked respectively, subjected to pressure bonding at 180 MPa by an isostatic press method, and then cut with a dicing saw into a size of 5 mm in width and 15 mm in length to prepare a sample for the measurement of the shrinkage start temperature. This sample was subjected to degreasing at 270° C. in the atmosphere, and the shrinkage start temperature of the sample was then measured by a thermo-mechanical analysis (TMA). It is to be noted that the shrinkage start temperature is a temperature at which shrinkage is started during a temperature increase in the thermo-mechanical analysis (TMA). Table 2 shows the measurement results for the shrinkage starting temperature measured in the way described above.

TABLE 2

|  | p-type metal thermoelectric conversion material | | | | n-type oxide thermoelectric conversion material |
| --- | --- | --- | --- | --- | --- |
|  | X = 5 | X = 10 | X = 20 | X = 50 |  |
| Shrinkage Start Temperature (° C.) | 800 | 820 | 830 | 850 | 850 |

(6) Preparation of Comparative Thermoelectric Conversion Element (Comparative Example)

Figure 5:
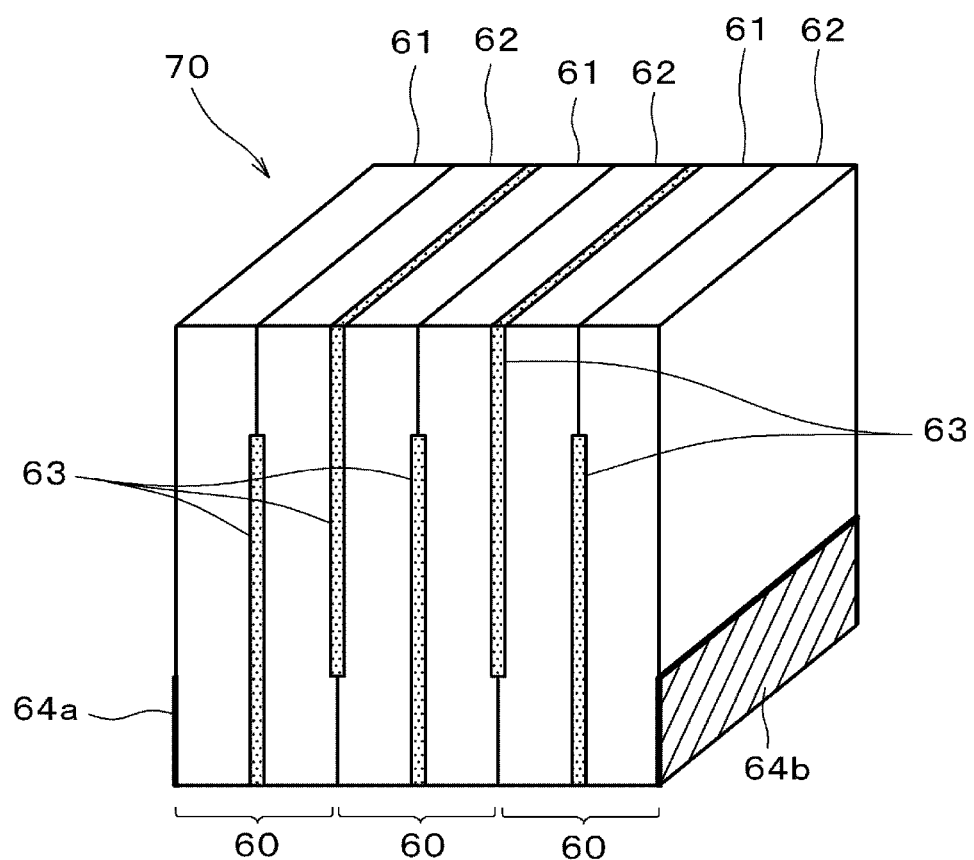
FIG. 5 is a diagram illustrating another conventional thermoelectric conversion element.

An oxide material was used for each of the p-type thermoelectric conversion material, n-type thermoelectric conversion material, and insulating material to prepare a comparative thermoelectric conversion element including a structure as shown in FIG. 5 (a thermoelectric conversion element including the same configuration as in WO 2009/001691).

First, $La_2O_3$, $SrCO_3$, and $CuO$ were prepared as starting raw materials for the p-type thermoelectric conversion material, and $Pr_6O_{11}$, $CeO_2$, and $CuO$ were prepared as starting raw materials for the n-type thermoelectric conversion material. Then, these starting raw materials were weighed so as to provide the compositions in Table 3.

TABLE 3

| p-type metal thermoelectric conversion material | n-type oxide thermoelectric conversion material |
| --- | --- |
| $(La_{1.97}Sr_{0.03})CuO_4$ | $(Pr_{1.97}Ce_{0.03})CuO_4$ |

The weighed raw material powders were put in a ball mill along with pure water (solvent) and PSZ media, and subjected to grinding in a ball mill for 16 hours. The obtained slurry was dried, and then subjected to calcination at 900° C. in the atmosphere.

The calcined powders obtained were subjected to grinding in a ball mill for 5 hours, and the obtained powders were further mixed for 16 hours with the addition of pure water, a binder, etc., thereto, thereby providing a slurry. This slurry was formed into sheets by a doctor blade method, thereby preparing p-type oxide thermoelectric conversion material sheets and n-type oxide thermoelectric conversion material sheets to be 30 μm in thickness after firing.

In addition, a $Mg_2SiO_4$ powder, a glass powder, varnish, and a solvent were mixed as materials for the insulator, and subjected to kneading by a roll machine to prepare an insulating paste.

Then, the prepared insulating paste was printed on each of the p-type oxide thermoelectric conversion material sheets and n-type oxide thermoelectric conversion material sheets prepared in the way described above, so as to be 15 μm in thickness.

Then, three of the p-type oxide thermoelectric conversion material sheets with no insulating paste applied thereto, one of the p-type oxide thermoelectric conversion material sheets with the insulating paste applied thereto, three of the n-type oxide thermoelectric conversion material sheets with no insulating paste applied thereto, and one of the n-type oxide thermoelectric conversion material sheets with the insulating paste applied thereto were stacked in this order, with the respective sheets sequentially stacked so as to reach 25 pairs in total, to prepare a laminate block. However, the lastly stacked n-type oxide thermoelectric conversion material sheet was used without the insulating paste printed thereon so that a thermoelectric conversion element was finally obtained without any insulating material layer formed on one and the other end surfaces in the stacking direction.

Thereafter, the prepared laminated body was subjected to pressure bonding at 180 MPa by an isostatic press method, and then cut with a dicing saw into a predetermined size, thereby providing an unfired laminated body (laminated element).

The laminated body obtained was subjected to degreasing at 480° C. in the atmosphere, and then subjected to firing at 900° C. to 1050° C., thereby providing a fired body. Then, this fired body was subjected to polishing, and an Ag paste was applied by screen printing onto lower end regions of both side surfaces, and subjected to firing to form electrodes for power extraction. Thus, a thermoelectric conversion element is achieved which uses oxide materials as all of the p-type thermoelectric conversion material, the n-type thermoelectric conversion material, and the insulating material.

For the samples according to the above-described non-limiting examples of preferred embodiments of the present invention and the samples according to the comparative example, which were prepared in the way described above, the appearances thereof were observed to check for the presence or absence of defects such as cracking or peeling in the junction plane between the p-type thermoelectric conversion material and the n-type thermoelectric conversion material, that is, the presence or absence of defects in the step (co-firing step) of firing the unfired laminated body for co-sintering. Table 4 shows the results.

TABLE 4

| | Sample Number | | | | |
|---|---|---|---|---|---|
| | 1 | 2 | 3 | 4 | 5* |
| Value of X | 5 | 10 | 20 | 50 | — |
| Presence of Defect in Co-firing | No | No | No | No | No |

*The sample of sample number 5 is a sample according to the comparative example (The samples of sample numbers 1 to 4 are samples according to the example).

As shown in Table 4, the samples according to the example of a preferred embodiment of the present invention (the samples of sample numbers 1 to 4) and the sample according to the comparative example (the sample of sample number 5) have no defect such as cracking or peeling generated in the junction plane between the p-type thermoelectric conversion material and the n-type thermoelectric conversion material in the step of firing the unfired laminated body for co-sintering.

This is considered to be because, in the case of the samples according to the example of a preferred embodiment of the present invention, there is a difference of about 50° C. or less in shrinkage start temperature due to the fact that the n-type oxide thermoelectric conversion material has the shrinkage start temperature of 850° C., whereas the p-type metal thermoelectric conversion material has the shrinkage start temperature of 800° C. to 850° C., making the heat shrinkage behaviors of the both materials close to each other during firing, and thus generating no defect such as cracking or peeling.

Furthermore, the samples according to the example according to a preferred embodiment of the present invention (the samples of sample numbers 1 to 4) and the sample according to the comparative example (the sample of sample number 5) were adjusted to have a temperature of 20° C. at the lower ends and a temperature of 320° C. at the upper ends, and the loads connected the samples were changed by an electronic load device to measure the voltage values and the current values, and thereby measure the values for the maximum outputs. In addition, the dimensions for each sample were measured with the use of a micrometer.

Table 5 shows the results of evaluating the outputs by measuring the voltage values and the current values with the use of the electronic load device in the way described above.

TABLE 5

| | Sample Number | | | | |
|---|---|---|---|---|---|
| | 1 | 2 | 3 | 4 | 5* |
| Value of X | 5 | 10 | 20 | 50 | — |
| Evaluation Result of Output | ⊙ | ⊙ | ⊙ | ○ | ○ |

*The sample of sample number 5 is a sample according to the comparative example (The samples of sample numbers 1 to 4 are samples according to the example).

It is to be noted that, for the evaluation of the outputs, the voltage values and the current values were measured by the electronic load device to regard the samples which succeeded in outputting as ○, and among the samples, evaluated the samples which produced higher outputs per unit area than that of the comparative example (the sample of sample number 5) as ⊙.

As shown in Table 5, it has been confirmed that among the samples (the samples of sample numbers 1 to 4) according to the example of a preferred embodiment of the present invention, the sample of sample number 4 with 50 weight % as the ratio (X) of the n-type oxide thermoelectric conversion material contained in p-type metal thermoelectric conversion material produces an output comparable to that of the sample according to the comparative example, whereas the samples of sample numbers 1 to 3 according to the example with 5 weight % to 20 weight % as the ratio (X) of the n-type oxide thermoelectric conversion material contained in p-type metal thermoelectric conversion material produce outputs higher than the sample according to the comparable example.

Figure 2:
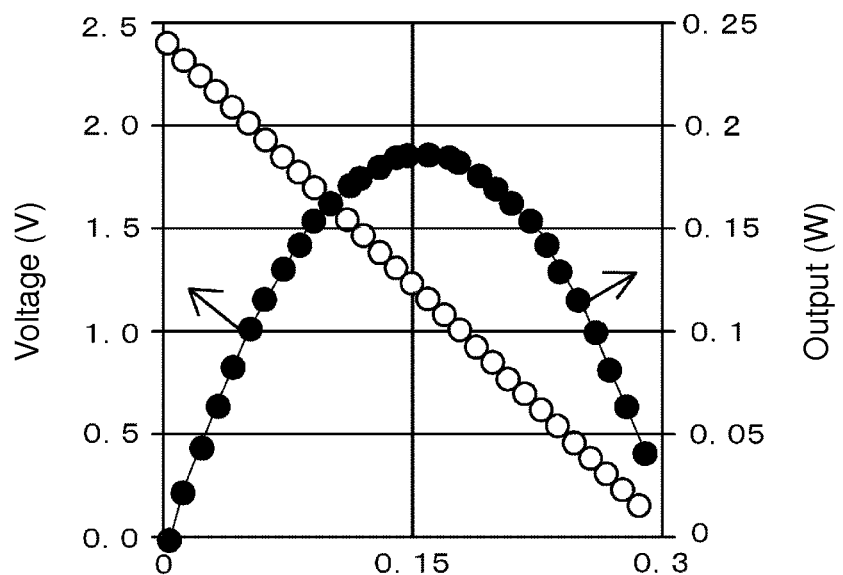
FIG. 2 is a diagram showing output characteristics examined for a sample according to an example of a preferred embodiment of the present invention.

It is to be noted that FIG. 2 shows the output characteristics examined for the sample of sample number 3 according to the example. As shown in FIG. 2, it is determined that the sample of sample number 3 according to the example has favorable output characteristics.

In addition, Table 6 shows the results of calculating the outputs per unit area from the outputs obtained for the sample of sample number 3 according to the example and the sample of sample number 5 according to the comparative example.

TABLE 6

| | Sample according to Example (Sample of Sample Number 3) | Sample according to Comparative Example (Sample of Sample Number 5) |
|---|---|---|
| Current (A) | 0.150 | 0.023 |
| Voltage (V) | 1.245 | 2.31 |
| Resistance (Ω) | 8.3 | 52 |
| Output (W) | 0.187 | 0.026 |
| Area Dimensions (cm × cm) | 0.7 × 0.6 | 0.7 × 1.0 |
| Output per Unit Area (W/cm$^2$) | 0.450 | 0.040 |

As shown in Table 6, the case of the sample of sample number 3 according to the example of a preferred embodiment of the present invention succeeded in increasing the output as compared with the sample of sample number 5 according to the comparative example. It is to be noted that the ratio of sample number 3 to sample number 5 was 11.25 (0.45/0.040=11.25) in terms of improvement in output.

From the example described above, it has been confirmed that the use of a material containing the n-type oxide thermoelectric conversion material in a proportion of about 5 weight % to about 50 weight % as the p-type metal thermoelectric conversion material can achieve co-sintering between different types of materials (that is, between the p-type metal thermoelectric conversion material and the n-type oxide thermoelectric conversion material), and a thermoelectric conversion element manufactured in such a way exhibits favorable output characteristics. Further, the co-sintering enabled as described above eliminates the need for an electrode preparation step such as in the case of connection through an electrode, or a step of bonding an electrode to the p-type metal thermoelectric conversion material or the n-type oxide thermoelectric conversion material, and can achieve a significant reduction in manufacturing cost.

While the ratio (the value of X mentioned above) of the n-type oxide thermoelectric conversion material contained in the p-type metal thermoelectric conversion material falls within the range of about 5 weight % to about 50 weight % in the example described above, the ratio of the n-type oxide thermoelectric conversion material is desirably about 50 weight % or less typically, because there is a tendency to decrease the Seebeck coefficient if the ratio (the value of X mentioned above) of the n-type oxide thermoelectric conversion material contained in the p-type metal thermoelectric conversion material is greater than about 50 weight %.

In addition, if the ratio (the value of X mentioned above) of the n-type oxide thermoelectric conversion material contained in the p-type metal thermoelectric conversion material is less than about 5 weight %, there is a tendency to generate peeling or cracking in the junction plane (interface) of the n-type oxide thermoelectric conversion material contained in the p-type metal thermoelectric conversion material when co-firing was carried out, and the ratio of the n-type oxide thermoelectric conversion material is preferably about 5 weight % or more typically.

Therefore, in the case of using a material containing the n-type oxide thermoelectric conversion material as the p-type metal thermoelectric conversion material, typically, the content ratio (additive amount) of the n-type oxide thermoelectric conversion material preferably falls within the range of about 5 weight % to about 50 weight %, and moreover, more preferably falls within the range of about 5 weight % to about 20 weight % considering the output characteristics.

While the n-type oxide thermoelectric conversion material contained in the p-type metal thermoelectric conversion material achieves a difference of about 50° C. or less in shrinkage start temperature between the both materials in the example described above, it is also possible to reduce the difference in shrinkage start temperature between the both materials by other methods such as, for example, a method of adjusting the compositions of the thermoelectric conversion materials, or adjusting additives for the thermoelectric conversion materials.

It is to be noted that while oxides or carbonates for each constituent were preferably used as raw materials for the n-type oxide thermoelectric conversion material in the example described above, it is also possible to use other compounds such as hydroxides and alkoxides as long as the compounds can form metal oxides by firing.

In addition, while the Ni powder and the Mo powder were used as raw materials for the p-type metal thermoelectric conversion material, it is also possible to use Cr in place of Mo, and in that case, it is also possible to achieve comparable thermoelectric conversion material properties. It is also possible to further use other materials as raw materials for the p-type metal thermoelectric conversion material.

In addition, the powders as starting raw materials for the n-type oxide thermoelectric conversion material and the p-type metal thermoelectric conversion material are not particularly limited in particle size, etc. in preferred embodiments of the present invention. However, conditions such as the particle size are preferably selected in consideration of uniform mixing. The conditions such as the mixing time for the raw materials in the ball mill are also not particularly limited, and can be determined appropriately in consideration of uniform mixing. In addition, it is also possible to use devices other than the ball mill for the mixing.

In addition, while the respective raw materials were weighed so as to provide the compositions in Table 1 in the example described above, Mo, $La_2O_3$, and other additives are selected appropriately depending on the required thermoelectric property, power generation characteristics, conditions required for co-sintering, etc. In addition, if required for the co-sintering, other elements may be added.

In addition, while calcination was carried out at 1300° C. in the example described above, there is no particular limitation in firing method and firing conditions for the calcination, equipment used for the calcination, etc. However, the excessively low calcination temperature makes the reaction less likely to proceed, and the firing (calcination) is thus preferably carried out at a temperature of about 1200° C. or more, for example.

In addition, while the mixing time for the calcined powder in the ball mill was 5 hours in the example described above, there is no particular limitation as long as co-sintering can be achieved for the p-type metal thermoelectric conversion material and the n-type oxide thermoelectric conversion material.

In addition, while the main firing was preferably carried out at about 1200° C. to about 1350° C. in the reducing atmosphere with an oxygen partial pressure of about $10^{-10}$ to $10^{-15}$ MPa in the example described above, it is not necessary to apply any special firing method such as firing under pressure to the main firing. However, the thermoelectric conversion element according to preferred embodiments of the present invention can be prepared even when firing under pressure is applied such as hot press, SPS sintering (Spark Plasma Sintering), or HIP sintering. In addition, the temperature for the main firing is also not particularly limited.

In addition, while the isostatic press method was used in the pressure bonding for the laminated body in the example described above, the pressure bonding is not to be considered limited to this method, and other methods may be used.

In addition, while there is particularly no problem as long as the firing atmosphere is an atmosphere which does not oxidize any Ni alloy, sintering will not proceed at lower firing temperatures. Thus, the firing is desirably carried out at a temperature which results in a sintered body with a relative density of about 90% or more, and at a temperature which allows co-sintering.

In addition, the thermoelectric property of the n-type oxide thermoelectric conversion material varies significantly depending on the firing temperature and the oxygen partial pressure, and it is thus desirable to select optimum conditions appropriately.

In addition, while the $Zr_{0.97}Y_{0.03}O_2$ powder was preferably used for the insulator (composite oxide insulating material) without the addition of glass in the example described above, it is also possible to add glass. It is possible to appropriately select the ratio of the glass to the oxide as the insulating material, depending on the conditions required for co-sintering among the p-type metal thermoelectric conversion material, the n-type oxide thermoelectric conversion material, and the insulator (composite oxide insulating material).

In addition, in the case of adding glass, the constituent elements of the glass are not particularly limited. In addition, while the content ratio of the glass is also not particularly limited as long as it is possible to carry out co-sintering with the p-type metal thermoelectric conversion material and the n-type oxide thermoelectric conversion material, the excessively high content ratio of glass causes the glass to diffuse into the thermoelectric conversion material to decrease the output characteristics. Thus, the glass is preferably contained so that the ratio thereof is about 10 weight % or less in the composite oxide insulating material.

In addition, in the case of using glass, while the softening point of the glass is not particularly limited, the low glass softening point will cause the constituent elements of the glass to diffuse into the thermoelectric conversion material to lead to a decrease in output characteristics when the firing temperature (main firing temperature) of the laminated body preferably is about 1200° C. to about 1350° C. as in the case of the example of a preferred embodiment of the present invention. Thus, it is preferable to use glass with a glass softening point of about 1000° C. or higher, for example.

In addition, there are also no limitations particularly on the thicknesses of the p-type metal thermoelectric conversion material, n-type oxide thermoelectric conversion material, and composite oxide insulating material, the number of connections (number of couple) of the pn junction pair(s), etc., which can be selected appropriately in consideration of the targeted electromotive force or electric current, the resistance of the load used, etc.

Example 2

Prepared were p-type metal thermoelectric conversion material sheets and n-type oxide thermoelectric conversion material sheets, with the use of a p-type thermoelectric conversion material with 20 wt % as the value of X in the formula:

$$Ni_{0.9}Mo_{0.1}(100-X)\text{wt \%} + (Sr_{0.965}La_{0.035})TiO_3 X \text{ wt \%}$$

in the column of p-type metal thermoelectric conversion material in Table 1, that is, as the mixture ratio of the n-type oxide thermoelectric conversion material in the p-type metal thermoelectric conversion material, and the n-type oxide thermoelectric conversion material ($(Sr_{0.965}La_{0.035})TiO_3$) shown in Table 1.

In addition, a $Zr_{0.97}Y_{0.03}O_2$ powder, varnish, and a solvent were mixed as materials for forming the insulator (composite oxide insulating material), and subjected to kneading by a roll machine to prepare an insulating paste.

Then, the p-type metal thermoelectric conversion material sheets, the n-type oxide thermoelectric conversion material sheets, and the insulating paste were stacked so as to be 100 μm, 25 μm, and 5 μm in thickness, for 50 pairs of pn laminates, thereby preparing a thermoelectric conversion element (laminate-type thermoelectric conversion element) of 6 mm in width, 7 mm in length, and 2.7 mm in thickness, for example. It is to be noted that the method for manufacturing the thermoelectric conversion element (laminate-type thermoelectric conversion element) was implemented in accordance with the method for manufacturing the thermoelectric conversion element in the section of (4) Preparation of Thermoelectric Conversion Element in Example 1 described above.

Figure 3:
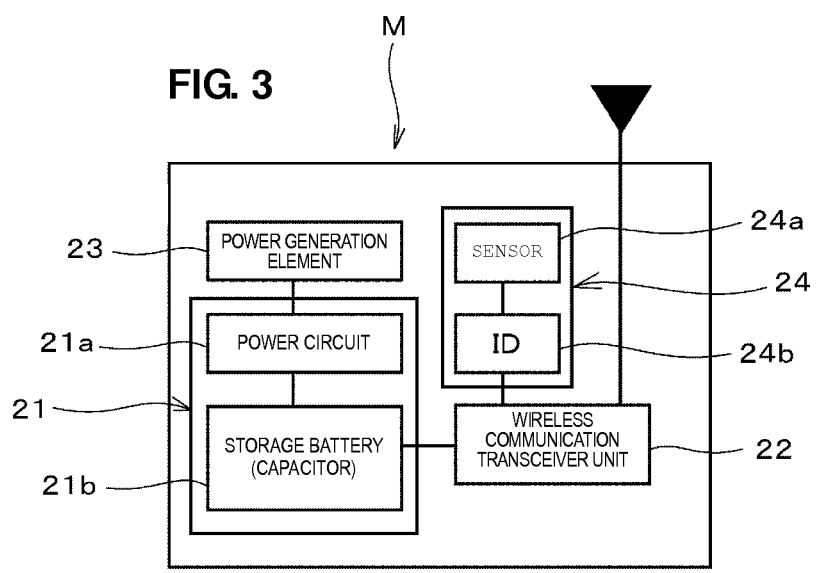
FIG. 3 is a diagram illustrating the configuration of a communication device according to an example of a preferred embodiment of the present invention.
Figure 4:
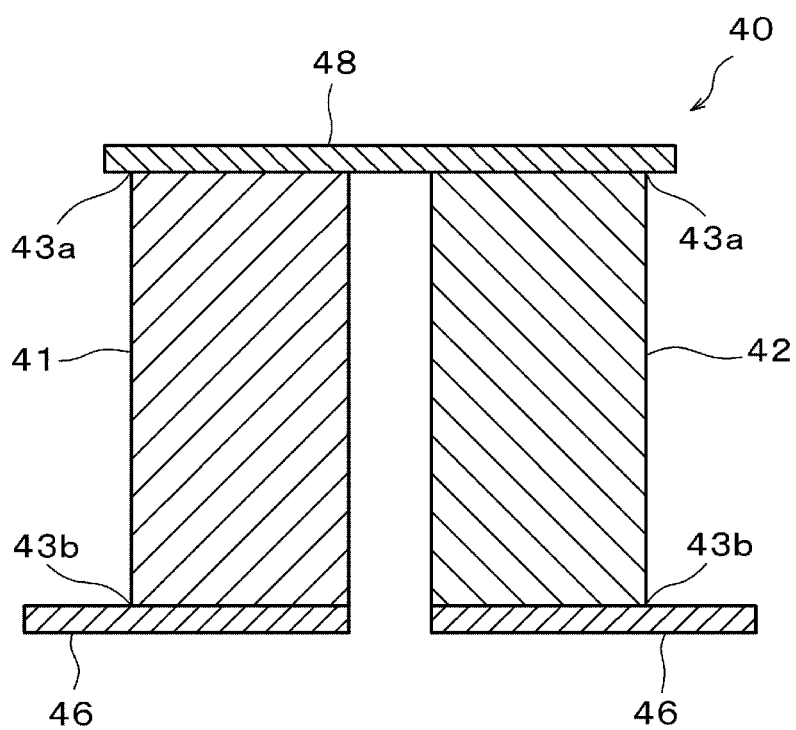
FIG. 4 is a diagram illustrating a conventional thermoelectric conversion element.

Then, this thermoelectric conversion element was used to prepare a communication device (harvesting module) M configured as shown in FIG. 3.

This communication device (harvesting module) M is a communication device including a power management circuit unit 21, a wireless communication transceiver unit 22, and a power generation element 23, and a thermoelectric conversion element (laminate-type thermoelectric conversion element) prepared in the way described above is used as the power generation element 23. It is to be noted that the laminate-type thermoelectric conversion element described above is singularly used as the power generation element 23.

The power management circuit 21 includes a DC-DC converter (power circuit) 21a and a storage battery (capacitor) 21b.

Furthermore, the communication device (harvesting module) M according to this example includes a sensor unit 24 including a sensor 24a and an ID 24b.

The power management circuit 21 is a circuit in which the voltage is increased to 3.5 V by the DC-DC converter (LTC3108 from Linear Technology, Corp.) (power circuit 21a) for the lowest input voltage of 20 mV to store electricity in the capacitor (storage unit 21b) of 100 μF, and a radio signal is transmitted at the stage of charging completed.

Then, this communication device (harvesting module) M was used to generate power in the power generation element 23, transmit a radio signal, and check the performance.

However, for the transmission of the radio signal, the operation of only transmitting the ID was carried out without mounting the sensor 24a in FIG. 3.

As a result, it has been confirmed that power of 100 μW at 25 mV can be generated with a temperature difference of 10° C. in the power generation element 23, and radio signals can be transmitted with a cycle of about 15 sec.

The present invention is also not to be considered limited to the examples of preferred embodiments of the present invention described above further in other respects, and various applications and modifications can be made within the scope of the present invention, with respect to the specific constituents of the thermoelectric conversion element, such as the specific compositions of the p-type metal thermoelectric conversion material and n-type oxide thermoelectric conversion material, and raw materials for the compositions, the firing conditions in the manufacturing process, etc.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A thermoelectric conversion element comprising:
   a p-type metal thermoelectric conversion material containing at least 50 weight % metal;
   an n-type oxide thermoelectric conversion material containing an oxide as its main constituent; and
   a composite oxide insulating material containing a composite oxide as its main constituent;
   wherein the p-type metal thermoelectric conversion material and the n-type oxide thermoelectric conversion material are directly bonded in a region of a junction plane between the p-type metal thermoelectric conversion material and the n-type oxide thermoelectric conversion material;
   the p-type metal thermoelectric conversion material and the n-type oxide thermoelectric conversion material are bonded to each other with the composite oxide insulating material interposed therebetween in another region of the junction plane so as to define a plurality of pn junction pairs; and
   the p-type metal thermoelectric conversion material is provided on both ends of the thermoelectric conversion element;
   wherein the p-type metal thermoelectric conversion material contains the n-type oxide thermoelectric conversion material.

2. The thermoelectric conversion element according to claim 1, wherein
   the n-type oxide thermoelectric conversion material comprises a perovskite-type oxide represented by a composition formula $ABO_3$, where A and B are one or more elements; and
   the n-type oxide thermoelectric conversion material, the p-type metal thermoelectric conversion material, and the composite oxide insulating material are co-sintered together.

3. The thermoelectric conversion element according to claim 2, wherein there is a difference within about 50° C. in shrinkage start temperature in a thermo-mechanical analysis between the p-type metal thermoelectric conversion material and the n-type oxide thermoelectric conversion material.

4. The thermoelectric conversion element according to claim 1, wherein the n-type oxide thermoelectric conversion material contained in the p-type metal thermoelectric conversion material has a ratio of about 5 weight % to about 50 weight %.

5. The thermoelectric conversion element according to claim 1, wherein the n-type oxide thermoelectric conversion material contained in the p-type metal thermoelectric conversion material has a ratio of about 5 weight % to about 20 weight %.

6. The thermoelectric conversion element according to claim 2, wherein
the p-type metal thermoelectric conversion material contains a Ni alloy as its main constituent; and
the perovskite-type oxide represented by the composition formula $ABO_3$ is a perovskite-type oxide containing at least Sr as A, and containing at least Ti as B.

7. The thermoelectric conversion element according to claim 1, wherein the p-type metal thermoelectric conversion material contains $Ni_{0.9}Mo_{0.1}$(100–X) wt %+$(Sr_{0.965}La_{0.035})TiO_3$ X wt %, where X=5, 10, 20, or 50.

8. The thermoelectric conversion element according to claim 1, wherein the n-type oxide thermoelectric conversion material contains $(Sr_{0.965}La_{0.035})TiO_3$.

9. The thermoelectric conversion element according to claim 1, wherein each of the plurality of the pn junction pairs includes the p-type metal thermoelectric conversion material having a thickness of about 25 μm and the n-type oxide thermoelectric conversion material having a thickness of about 100 μm.

10. The thermoelectric conversion element according to claim 1, wherein the thickness of the p-type metal thermoelectric conversion material is less than the thickness of the n-type oxide thermoelectric conversion material.

* * * * *